United States Patent
Hu

(10) Patent No.: US 10,108,291 B2
(45) Date of Patent: Oct. 23, 2018

(54) FABRICATION METHOD OF AN ARRAY SUBSTRATE

(71) Applicant: BOE TECHNOLOGY GROUP CO., LTD, Beijing (CN)

(72) Inventor: Hehe Hu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 146 days.

(21) Appl. No.: 15/031,257

(22) PCT Filed: Aug. 14, 2015

(86) PCT No.: PCT/CN2015/086947
§ 371 (c)(1),
(2) Date: Apr. 21, 2016

(87) PCT Pub. No.: WO2016/107185
PCT Pub. Date: Jul. 7, 2016

(65) Prior Publication Data
US 2016/0334918 A1 Nov. 17, 2016

(30) Foreign Application Priority Data

Dec. 29, 2014 (CN) .......................... 2014 1 0836507

(51) Int. Cl.
*H01L 27/00* (2006.01)
*H01L 29/00* (2006.01)
(Continued)

(52) U.S. Cl.
CPC ............ *G06F 3/0416* (2013.01); *G06F 3/042* (2013.01); *G06F 3/0412* (2013.01);
(Continued)

(58) Field of Classification Search
CPC . H01L 27/1225; H01L 27/124; H01L 27/127; H01L 27/15; H01L 29/78693;
(Continued)

(56) References Cited

U.S. PATENT DOCUMENTS 4,391,892 A * 7/1983 Kamezaki .............. G03G 5/087
101/DIG. 37
8,525,142 B2 * 9/2013 Bourim ................... H01L 45/12
257/2
(Continued)

FOREIGN PATENT DOCUMENTS

CN 102136499 A 7/2011
CN 102254582 A 11/2011
(Continued)

OTHER PUBLICATIONS

Wang et sl., "Ternary Self-Assembly of Ordered Oxide-Graphene Nanocomposites . . . ", 2010, ACS NANO, vol. 4, No. 3, pp. 1565-1595 (published Feb. 25, 2010).*
(Continued)

*Primary Examiner* — Nikolay Yushin
(74) *Attorney, Agent, or Firm* — Anova Law Group, PLLC

(57) ABSTRACT

A thin-film transistor is provided. The thin film transistor includes a substrate; an active layer configured as a channel of the thin-film transistor, wherein the active layer is a mixture of oxide semiconductor and graphene; and a source and a drain.

6 Claims, 3 Drawing Sheets

(51) Int. Cl.
G06F 3/041 (2006.01)
H01L 29/66 (2006.01)
H01L 29/786 (2006.01)
G06F 3/042 (2006.01)
H01L 27/12 (2006.01)
H01L 29/22 (2006.01)
H01L 29/24 (2006.01)
H01L 29/16 (2006.01)

(52) U.S. Cl.
CPC .......... *H01L 27/124* (2013.01); *H01L 27/127* (2013.01); *H01L 27/1225* (2013.01); *H01L 29/2206* (2013.01); *H01L 29/247* (2013.01); *H01L 29/66742* (2013.01); *H01L 29/66969* (2013.01); *H01L 29/7869* (2013.01); *H01L 29/78606* (2013.01); *H01L 29/78684* (2013.01); *H01L 29/78693* (2013.01); *H01L 29/78696* (2013.01); *G06F 2203/04103* (2013.01); *H01L 29/1606* (2013.01)

(58) Field of Classification Search
CPC ............. H01L 29/78606; H01L 29/247; H01L 29/2206; H01L 29/66742; H01L 29/66969; H01L 29/78684; H01L 29/7869; H01L 29/78696; H01L 29/1606; G06F 3/042; G06F 3/0416; G06F 3/0412; G06F 2203/04103; G06F 2203/04106; G06F 2203/04105
See application file for complete search history.

(56) References Cited

U.S. PATENT DOCUMENTS

| 9,082,862 | B2* | 7/2015 | Hsieh | H01L 29/66969 |
| 9,231,222 | B2* | 1/2016 | Sung | H01L 51/0541 |
| 9,306,099 | B2* | 4/2016 | Choi | H01L 31/035227 |
| 2011/0114914 | A1* | 5/2011 | Numata | H01L 27/12 257/9 |
| 2011/0129675 | A1* | 6/2011 | Choi | H01L 31/035227 428/408 |
| 2011/0284818 | A1 | 11/2011 | Avouris | |
| 2013/0175505 | A1* | 7/2013 | Sung | H01L 51/0541 257/29 |
| 2015/0123110 | A1* | 5/2015 | Hsieh | H01L 29/7869 257/43 |

FOREIGN PATENT DOCUMENTS

| CN | 102531096 A | 7/2012 |
| CN | 103247689 A | 8/2013 |
| CN | 103839608 A | 6/2014 |
| CN | 104103671 A | 10/2014 |
| CN | 104538453 A | 4/2015 |

OTHER PUBLICATIONS

Song et al., "Determination of Work Function of Graphene . . . ", 2013, ACS, NANO letters, vol. 12, pp. 3887-3892, published Jul. 9, 2012.*

Su et al., "Two-Dimensional Carbon-Coated Graphene/Metal Oxide Hybrids . . . ", 2012, American Chemical Society, ACSNANO, vol. 6, No. 6, pp. 8349-8356, published Aug. 29, 2012.*

Song, Wooseok et al., "High-Mobility Ambipolar ZnO-Graphene Hybrid Thin Film Transistors", Scientific Reports, 2014, vol. 4, Nature Publishing Group.

Heo, Jinseong et al., "Graphene and Thin-Film Semiconductor Heterojunction Transistors Integrated on Wafer Scale for Low-Power Electronics", Nano Letters, Nov. 25, 2013, pp. 5967-5971, vol. 13, Issue 12, American Chemical Society.

Dai, Min-Kun et al., "High-performance transparent and flexible inorganic thin film transistors: a facile integration of graphene nanosheets and amorphous InGaZnO", Journal of Materials Chemistry C, 2013, pp. 5064-5071, vol. 1, Issue 33, Royal Society of Chemistry.

State Intellectual Property Office of the P.R.C (SIPO) Office Action 1 for 201410836507.0 Feb. 3, 2017 18 Pages.

The World Intellectual Property Organization (WIPO) International Search Report for PCT/CN2015/086947 Nov. 19, 2015 2 Pages.

* cited by examiner

FABRICATION METHOD OF AN ARRAY SUBSTRATE

CROSS-REFERENCES TO RELATED APPLICATIONS

This patent application is a national phase entry under 35 U.S.C. § 371 of International Application No. PCT/CN2015/086947, filed on Aug. 14, 2015, which claims priority to Chinese Patent Application No. 201410836507.0, filed on Dec. 29, 2014, the entire contents of both which are incorporated by reference herein.

FIELD OF THE INVENTION

The present invention generally relates to the field of the display technology and, more particularly, to a thin-film transistor, a related array substrate and fabrication method, and a display device.

BACKGROUND

Amorphous oxide semiconductor display panel is currently one of the most-researched topics of display panel industry. However, amorphous oxide semiconductor may be unstable, which may be etched away when the source and the drain of a transistor are formed on the top of the amorphous oxide semiconductor by an etching process.

Therefore, according to the present disclosure, how to prevent the corrosion of the amorphous oxide semiconductor during the etching process for forming the source and the drain has become an urgent technical issue to be solved. The disclosed device structures, methods and systems are directed to at least partially solve one or more problems set forth above and other problems.

BRIEF SUMMARY OF THE DISCLOSURE

The present invention provides a thin-film transistor, an array substrate and related fabrication method, and a display device. When the source and the drain of the thin-film transistor are formed by an etching process, the active layer, i.e., the channel of the disclosed transistor may not be damaged.

One aspect of the present invention includes providing a thin-film transistor. The thin film-transistor includes a substrate; an active layer configured as a channel, wherein the active layer is a mixture of oxide semiconductor and graphene; and a source and a drain.

Optionally, the graphene is in a form of micro-sheet, the micro-sheets being evenly distributed in irregular directions to protect the active layer from being damaged during subsequent etching process, a work function of the oxide semiconductor is smaller than a work function of graphene Optionally, the oxide semiconductor is made of one of ZnO, InO, AlInO, IGZO, YZO and ITZO.

Optionally, the thickness of the oxide semiconductor is in a range of approximately 600 Å~2000 Å.

Optionally, the oxide is a metal oxide; and the ratio of the number of moles of metal atoms to carbon atoms is in a range of approximately 1:1 to 1:10 in the active layer.

Another aspect of the present invention includes providing an array substrate having a plurality of pixel units. Each pixel has at least a disclosed thin-film transistor.

Another aspect of the present invention includes providing a fabrication method of the array substrate. The method includes providing a substrate; forming a pattern having an active layer configured as a channel of a thin-film transistor on the substrate, wherein the active layer wherein the active layer is a mixture of oxide semiconductor and graphene, and a work function of oxide is smaller than a work function of the graphene for forming the graphene micro-sheet; and forming a pattern having a source and a drain on the substrate having the pattern with the active layer.

Optionally, the graphene is in a form of micro-sheet, the micro-sheets being evenly distributed in irregular directions to prevent the active layer from being damaged during a subsequent etching process.

Optionally, a process for forming the pattern having the active layer on the substrate includes coating a homogeneous mixture of oxide semiconductor and graphene on the substrate, wherein the homogeneous mixture formed on the substrate has a shape of the active layer of the thin-film transistor; and baking and annealing the substrate coated with the homogeneous mixture.

Optionally, a temperature for baking the homogenous mixture is in a range of approximately 40° C.~120° C.; and a duration is in a range of approximately 0.5 h~1 h.

Optionally, a temperature for annealing solute of the homogenous mixture after the baking process is in a range of approximately 200° C.~400° C.; an inert gas atmosphere is used in the annealing process; and a duration of the annealing process is in a range of approximately 1 h~2 h.

Optionally, the metal salt solution is any one of $Zn(NO_3)_2$ solution, $In(NO_3)_3$ solution, and $SnCl_2$ solution.

Another aspect of the present invention includes providing a display device. The display device comprises at least a disclosed array substrate.

In the thin-film transistor provided by the present disclosure, the active layer, i.e., the channel region of the thin film transistor, is a mixture of oxide semiconductor and graphene. The graphene may be significantly stable. The bond length of C—C is approximately 1.42 Å and the diameter of the circumscribed circle of the six-member ring formed with C—C is approximately 2.84 Å. The oxide semiconductor material may be surrounded by a plurality of such graphene layers, which is equivalent to a plurality of graphene superposed together. Therefore, the eventually formed ion channels may be much smaller than the radius of atoms or ions of etchants of a subsequent etching process. Thus, the graphene may form a dense framework for the oxide semiconductor such that the oxide semiconductor may be not susceptible to external corrosion during the etching process. That is, the channel region of the thin-film transistor may be not be etched during the etching process. Furthermore, the thin-film transistor provided by the present disclosure may have relatively high carrier mobility, because the graphene layers are used.

Other aspects of the present disclosure can be understood by those skilled in the art in light of the description, the claims, and the drawings of the present disclosure.

BRIEF DESCRIPTION OF THE DRAWINGS

Drawings are used as a part of the disclosure to further illustrate the present invention; and do not constitute limitations of the present invention. In the drawings.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Figure 1:
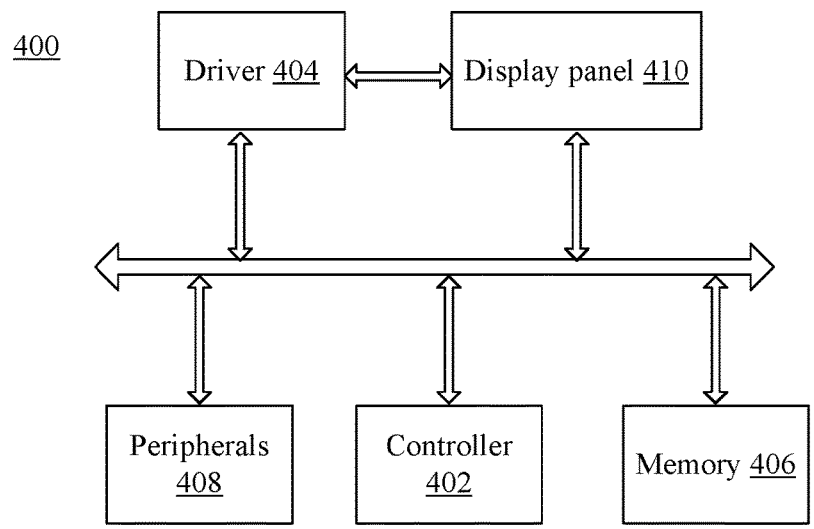
FIG. 1 illustrates a block diagram of an exemplary display device according to the disclosed embodiments.

According to the disclosed embodiment, a display device is provided. FIG. 1 illustrates an exemplary display device 400 incorporating a disclosed array substrate and other aspects of the present disclosure. The display device 400 may be any appropriate device or component with certain display function, such as a display panel, a television, an LCD, an OLED, an electronic paper, a digital photo frame, a mobile phone or a tablet computer, etc. As shown in FIG. 13, the display device 400 includes a controller 402, a driver circuit 404, a memory 406, peripherals 408, and a display panel 410. Certain devices may be omitted and other devices may be included.

The controller 402 may include any appropriate processor or processors. The memory 406 may include any appropriate memory modules. The memory 406 may store computer programs for implementing various processes, when executed by the controller 402.

Peripherals 408 may include any interface devices for providing various signal interfaces, Peripherals 408 may also include any appropriate communication module for establishing connections through wired or wireless communication networks.

The driver circuitry 404 may include any appropriate driving circuits to drive the display panel 410; and the driving circuit may include the disclosed transistors and array substrate. The display panel 410 may include at least a disclosed array substrate. During an operation, the display 410 may be provided with image signals by the controller 402 and the driver circuit 404 for display.

Figure 7:
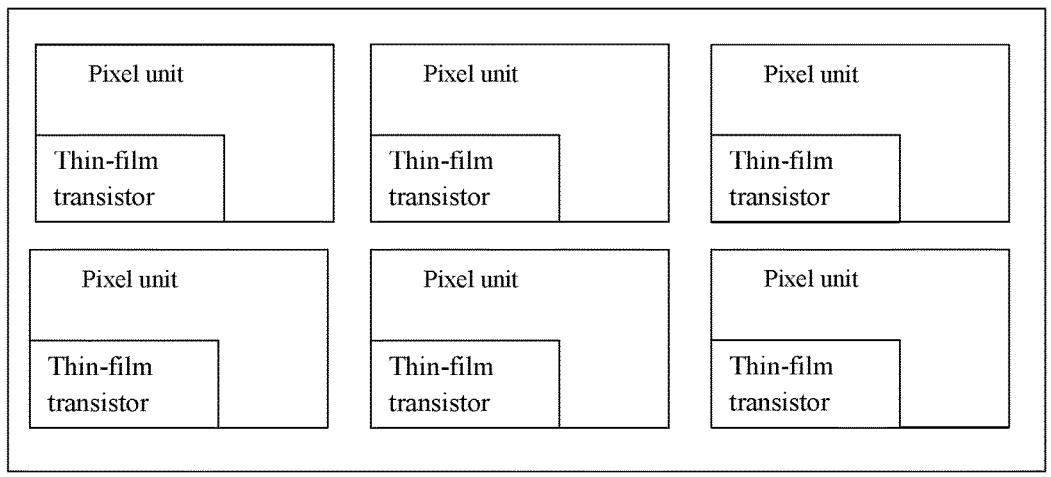
FIG. 7 illustrates exemplary pixel units, each of which includes at least one thin-film transistor according to some embodiments of the present application.

Further, according to the disclosed embodiments, an array substrate is provided in the present disclosure. The display panel may be incorporated in the disclosed display device. The array substrate may include a plural of pixel units; and each pixel unit may include at least one thin-film transistor, as shown in FIG. 7.

Gate lines and data lines configured to divide the array substrate into a plurality of pixel units may also be formed on the array substrate. In addition, common electrode lines, pixel electrodes and common electrodes may also be formed on the array substrate. The gate lines, data lines, common electrode lines, pixel electrodes and common electrodes may be disposed by any appropriate layout.

Further, according to the disclosed embodiments, a thin film transistor is provided. At least a thin film transistor may be included in the disclosed array substrate.

Figure 2:
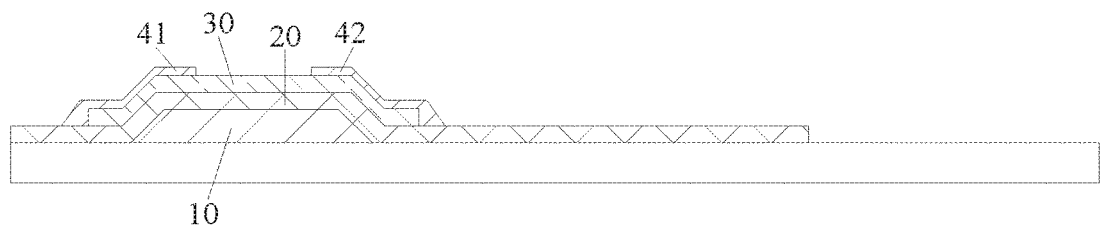
FIG. 2 illustrates an exemplary thin-film transistor having a bottom gate according to the disclosed embodiments.

FIG. 2 illustrates an exemplary thin-film transistor having a bottom gate structure according to the disclosed embodiments. As shown in FIG. 2, the thin-film transistor may include a gate structure 10 below an active layer 30, i.e., a bottom gate structure, and a gate insulation layer 20 between the gate structure 10 and the active layer 30. Further, the thin film transistor may also include a source 41 and a drain 42 formed on top surface of the active layer 30. The portion of the active layer 30 between the source 41 and drain 42 of the thin-film transistor may be configured as the channel of the thin-film transistor.

The active layer 30 may be made of any appropriate material. In one embodiment, the active layer 30 is made of a semiconductor material having a mixture structure.

Figure 6:
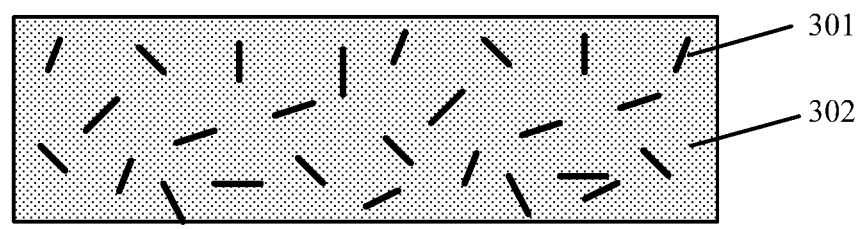
FIG. 6 illustrates an exemplary active layer with a mixture of graphene micro-sheets and oxide semiconductor.

Specifically, the active layer 30 may be a mixture of oxide semiconductor and graphene. The graphene may be in a form of micro-sheets. That is, the graphene may be single layer graphene or multilayer graphene. As shown in FIG. 6, the graphene micro-sheet 301 may be randomly distributed in the mixture to form a framework; and the oxide semiconductor 302 may be filled in the framework. In one embodiment, the work function of the oxide semiconductor is smaller than the work function of graphene.

Figure 3:
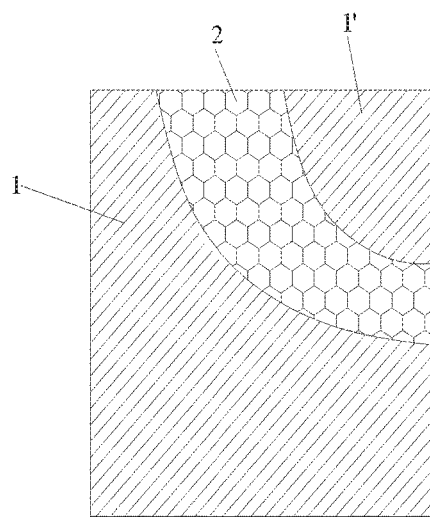
FIG. 3 illustrates the active layer of an exemplary thin-film transistor according to the disclosed embodiments.

FIG. 3 illustrates the active layer 30 of the exemplary thin-film transistor according to the disclosed embodiments. As shown in FIG. 3, the outmost layer of the active layer 30 may be an oxide semiconductor layer 1; a graphene layer 2 under the oxide semiconductor layer 1 may be exposed after a portion of the oxide semiconductor 1 is sectioned; and another oxide semiconductor 1' under the graphene 2 may be exposed after a portion of the graphene layer 2 is sectioned. That is, the graphene and the oxide semiconductor form a laminated structure.

Therefore, the active layer 30 may be a mixture of oxide semiconductor and graphene. The graphene may be significantly stable. The bond length of C—C bond is approximately 1.42 Å; and the diameter of the circumscribed circle of the six-member rings formed with C—C is approximately 2.84 Å.

Figure 4:
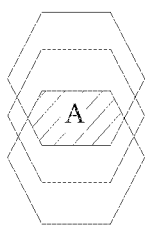
FIG. 4 illustrates an exemplary ion channel having a plurality of interlaced graphene layers according to the disclosed embodiments.

Further, there may be a plurality of graphene micro-sheets between the oxide semiconductor layers or particles. That is, the plurality of graphene micro-sheets may be superposed together. Thus, as shown in FIG. 4, the eventually formed ion channel "A" may be much smaller than the radius of atoms or ions of the oxide semiconductor and the etchants of the subsequent etching process. Thus, the graphene layers may form a dense framework for the oxide semiconductor such that the oxide semiconductor may not be susceptible to external corrosion during subsequent etching process. Thus, an etching-stop layer may be unnecessarily included in the thin-film transistor.

Therefore, the structure of the thin-film transistor provided in the present disclosure may be simplified. Further, during the manufacturing of the thin-film transistor, the step for forming an etch-stop layer may be omitted. The manufacturing process may be simplified; and the production cost may be reduced. Meanwhile, the existence of the graphene framework may reduce the influence of hydrogen on the oxide semiconductor.

The graphene is a two-dimensional semi-metallic nano-carbon allotrope; and has a two-dimensional hexagonal honeycomb lattice structure consisting of single layers of $sp^2$ carbon atoms. Thus, the graphene has a significantly stable structure. The thickness of a single layer of graphene is approximately 0.355 nm. Thus, it is almost transparent; and the visible light transmittance may be up to approximately 97.7%.

Further, the graphene is a zero bandgap semiconductor, in which the electron mobility is approximately $1/300$ of the light speed (i.e., 106 m/s), exhibiting anomalous quantum Hall-effect with the mobility of the massless Dirac fermion type carrier up to 200000 cm$^2$/v$^2$s. The resistivity of graphene is approximately 10$^{-6}$ Ω/cm, which is lower than the current lowest resistance of silver metal material (approximately 1.59×10$^{-6}$ Ω/cm) at room temperature.

The conductivity of graphene may be adjusted by controlling a gate voltage. However, the source-drain current of a graphene transistor may be unable to be completely shut down. In a graphene transistor, the source-drain current will not disappear even in the case where the carrier concentration is closed to zero. A transistor with a two-dimensional graphene thin film as a channel may not only be unable to completely cut off the current, but also have a switching ratio of approximately 5. Therefore, such a transistor may not be suitable for logic circuits.

The work function of graphene is about 4.6 eV. According to the thermal electron emission mechanism, when two semiconductors materials contact, the electrons always move from the semiconductor with smaller work function to the one with larger work function, while the free holes move in the opposite direction. Eventually, the system may reach an equilibrium state, i.e., Fermi-levels are even.

Figure 5:
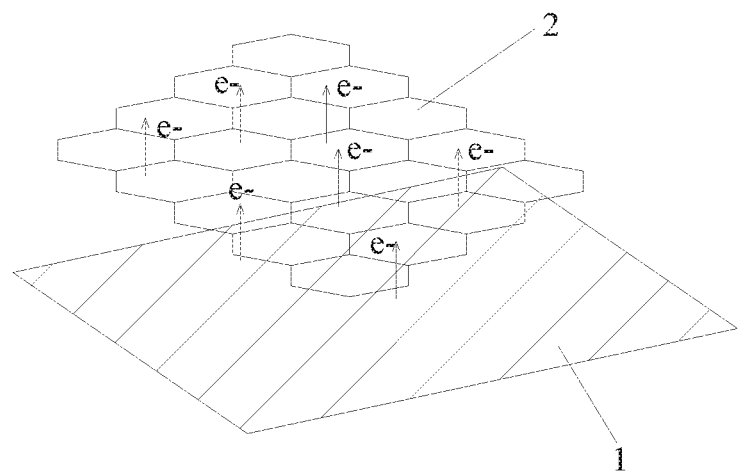
FIG. 5 illustrates an exemplary electron transfer from an oxide layer to a graphene layer according to the disclosed embodiments.

In the active layer provided in the present disclosure, because the work function of the oxide semiconductor may be smaller than that of graphene, and the carriers are electrons e$^-$, the electrons may transfer from the oxide semiconductor layer to the graphene layer, as shown in FIG. 5. Thus, the benefit of the high mobility of graphene may be utilized; and the mobility of the entire device may also be improved. Further, due to the presence of a large number of defects at the interface of the oxide semiconductor and the graphene, when a leakage current flows through the graphene, electrons with lower energy may be trapped by the defects. Thus, the leakage current may be reduced, or even eliminated. Because the active layer configured as the channel of the thin-film transistor may have both advantages of the high mobility of graphene and the high switching ratio of the oxide semiconductor, the thin-film transistor provided in the present disclosure may not require Ohmic contact layers. Thus, such a thin-film transistor may have a plurality of advantages, including high mobility, high switching ratio and stable performance, etc.

In the present disclosure, the material for forming the oxide semiconductor does not need to be particularly defined, as long as the work function of the oxide forming the oxide semiconductor is smaller than the work function of graphene. For example, the material of the oxide semiconductor may be any one or a combination of ZnO, InO, AlInO, IGZO, YZO and ITZO, etc. In order to ensure that the active layer has both good stability and high mobility, optionally, in the active layer, the molar ratio of metal atoms to carbon atoms may be in a range of approximately 1:1 to 1:10.

As stated above, the thickness of a single layer of graphene is approximately 0.355 nm and, optionally, the thickness of a single oxide semiconductor layer may be in a range of approximately 600 Å~2000 Å. Further, the thin-film transistor may have any appropriate specific structure. For example, the thin-film transistor may have a top gate structure or a bottom gate structure, etc.

As stated previously, due to the existence of the framework formed by the graphene, the influence of hydrogen to the oxide semiconductor may be reduced. Therefore, in the thin-film transistor provided by the present disclosure, the selection of the material of the gate insulation layer 20 may be made regardless of the influence of hydrogen on the active layer 30. Thus, the range of the selection of the material for the gate insulation layer 20 may be expanded; and the overall cost of the thin-film transistor may be reduced to a certain extent.

In the present disclosure, the gate structure 10 of the thin film transistor may be made of any appropriate material. Usually, conducting metal materials, such as Al, or Mo, etc., may be used to fabricate the gate structure 10.

Further, due to the high mobility of the disclosed thin-film transistors, when the array substrate having at least a disclosed thin-film transistor is used in a display device, the display device may have lower power consumption and a faster response rate. Further, the oxide semiconductor material used as the channel in the disclosed thin-film transistor may have a stable performance because of the graphene, it may not be affected when the source and the drain are formed by an etching process. Therefore, the quality of the display device may be improved.

In one embodiment, a process for forming an array substrate may include forming a pattern having an active layer on a substrate (S101); and followed by forming a pattern having a source and a drain on the substrate having the active layer (S102).

The active layer may be a mixture structure of oxide semiconductor and graphene. That is, the graphene layers may form a framework for the oxide semiconductor. The work function of the oxide for forming the oxide semiconductor may be smaller than that of the graphene for forming the graphene layers.

Further, because the active layer may be a mixture of oxide semiconductor and graphene, it may not be damaged when the pattern having the source and the drain are formed by an etching process. That is, the channel of the thin film transistor may not be damage during the etching process. Thus, the yield of the array substrate may be improved.

The pattern having the source and the drain may be formed by any appropriate process, such as a conventional photolithography process, or an inkjet printing process, etc. In one embodiment, the pattern having the source and the drain is formed by a conventional photolithography process.

An exemplary fabrication process of the patterns having the source and the drain by a conventional photolithography process may include, sequentially, forming a source/drain material layer on the substrate with the active layer (S201); forming a photoresist layer on the source drain/material layer (S202); performing an exposure and development process on the photoresist layer to form a patterned photoresist layer (S203); and etching the source/drain material layer using the patterned photoresist layer as an etching mask (S204). Thus, the pattern having the source and the drain may be formed.

The source/drain material layer may be formed by any appropriate process, such as a chemical vapor deposition process (CVD), or a physical vapor deposition (PVD) process. In one embodiment, the source/drain material layer is formed on the substrate with the active layer by a sputtering deposition process or an evaporation deposition process.

The source/drain material layer may be etched by any appropriate process, such as a dry etching process, a wet etching process, or an ion beam etching process. In certain other embodiments, the pattern having the source and the drain may be formed by directly evaporating a metal on the substrate having the active layer using a shadow mask.

In the present disclosure, the pattern having the active layer may be formed by any appropriate process. The oxide semiconductor and the graphene of the active layer may be formed sequentially, or by a single step.

In order to simplify the manufacturing process, the pattern having the active layer may be formed by a solution process. Specifically, the formation of the pattern having the active layer on the substrate may include coating the substrate with a homogeneous mixture of oxide semiconductor and the graphene which are formed by a metal salt solution and a graphene oxide solution (S301); and baking and annealing the substrate coated with the homogeneous mixture (S302).

The mixture may be coated by any appropriate process, such as a spin-coating process, or an inkjet printing process, etc. In one embodiment, an inkjet printing process is used to coat the mixture on the substrate. The homogeneous mixture coated by the inkjet printing process may have the shape of the active layer of the thin-film transistor.

The inkjet printing method may be able to provide the homogeneous mixture with the same shape as the corresponding pattern of the active layer. Comparing with other processes, such as an etching process, etc., the inkjet printing process may be much simpler, and may be easier to control.

Further, the raw material used to form the active layer may be a solution, which is easy to prepare and does not require a strict process environment. Thus, the cost for manufacturing the active layer may be reduced.

In the present disclosure, the homogeneous mixture may be prepared by any appropriate process. Optionally, the process may include mixing the metal salt solution and the graphene oxide solution; and processing the mixture to obtain a homogenous mixture.

Various processes may be used to process the mixture to obtain the homogenous mixture, such as being heated in water bath, being heated with microwave and being heated with pressure, etc.

Specifically, in one embodiments, metal salt and graphene oxide may be mixed with NaOH solution to obtain a mixture solution. The mixture solution may be put in a water bath with an appropriate temperature; and the metal salt be reacted with the graphene oxide. Thus, a mixture of metal oxide and graphene layers may be obtained. The metal oxide may be the oxide semiconductor. The chemical reaction of in the water bath may be described as following:

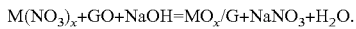

$M(NO_3)_x + GO + NaOH = MO_x/G + NaNO_3 + H_2O$.

Wherein M refers to Metal, and G refers to graphene. The metal salt and grapheme oxide may be mixed with any other solution with alkaline condition. After the reaction in the water bath, the mixture of the oxide semiconductor and the graphene may be dispersed with de-ionized water and/or acetone to obtain the homogenous mixture.

When the mixture of the metal salt solution and the graphene oxide solution is processed in a water bath, the temperature of the water bath may be in a range of approximately 60° C.~80° C.; and the duration may be in a range of approximately 0.5 h~2 h.

When the mixture of the metal salt solution and the graphene oxide solution is heated by a microwave, the heating temperature may be in a range of approximately 100° C.~200° C.; and the duration may be in a range of approximately 0.5 h~2 h.

When the mixture of the metal salt solution and the graphene oxide solution is treated with pressure, the pressure may be in a range of approximately 0.1 MPa~5 MPa and the duration may be in a range of approximately 0.5 h~2 h.

In present disclosure, the metal salt solution may have any appropriate composition, as long as the oxide semiconductor may be formed.

The molecular structure of graphene oxide has oxygen-containing functional groups (hydroxyl group, epoxy group, carboxyl group). When the material layer formed by coating mixture solution is treated, metal ions may capture oxygen in graphene oxide; and remove the oxygen-containing functional groups from the molecular structure of the graphene oxide. Thus, metal oxides and the graphene may be formed simultaneously.

The material for the oxide semiconductor may be any one or a combination of ZnO, InO, AlInO, IGZO, YZO and ITZO, etc. Accordingly, the metal salt solution may be one or more of $Zn(NO_3)_2$ solution, $In(NO_3)_3$ solution, and $SnCl_2$ solution, etc. To ensure that the oxide semiconductor may have both good stability and high mobility, optionally, the ratio of the number of moles of metal atoms to carbon atoms may be in a range of approximately 1:1 to 1:10. Therefore, the concentration of the metal salt solution may be in a range of approximately 0.1 mol/L~1 mol/L. The concentration of the graphene oxide solution may be in a range of approximately 0.1 mg/mL~5 mg/mL.

In the present disclosure, how the mixture material is processed is not particularly defined, as long as the metal oxide and graphene may be formed eventually.

In the present disclosure, the purpose for baking the homogeneous mixture coated on the substrate is to evaporate the solvent in the mixture material layer. Optionally, the temperature for baking the mixture material layer may be in a range of approximately 40° C.~120° C.; and the duration may be in a range of approximately 0.5 h~1 h.

After the baking process, the remaining solute may be annealed. The temperature for annealing the remaining solute may be in a range of approximately 200° C.~400° C.; and the duration may be in a range of approximately 1 h~2 h.

In order to prevent the graphene from being re-oxidized, inert gas may be used as a protective gas. The protective gas may be any appropriate gas. In one embodiment, the inert protective gas is argon.

Because the active layer may be a mixture of oxide semiconductor and graphene, the active layer, i.e., the channel of the thin-film transistor, may not be damaged during the process for forming the pattern having the source and the drain by an etching process. Thus, the yield of the array substrate may be enhanced.

In the present invention, the specific structure of the thin-film transistor in the array substrate is not particularly defined. For example, the thin-film transistor may have a bottom gate structure. The method for fabricating array substrate may further include forming a pattern having the gate on the substrate before forming the pattern having the active layer.

In certain other embodiments, the thin-film transistor may have a top gate structure. The process for forming the array substrate may further include forming a pattern having the gate structure on the active layer after forming the pattern having the active layer.

The pattern having the gate may be formed by a conventional photolithography process, or an inkjet printing process, etc.

When the pattern having the gate structure is formed by a conventional photolithography process, the process may include, sequentially, forming a gate material layer on the substrate having the active layer by a sputtering deposition process or a evaporation deposition process; forming a photoresist layer on the gate material layer; performing an exposure and developing process on the photoresist layer to form a patterned photoresist layer; and etching the gate material layer using the patterned photoresist layer after as an etching mask. Thus, the pattern having the gate structure may be formed.

It may be easy to understand that, source/drain layers may also necessarily be formed after the formation of the pattern having the active layer. Because the active layer may have a good resistance to acid and alkali, a metal layer may be directly deposited on the top of the active layer to form the source and drain. After forming the source and the drain, the active layer between the source and the drain may become a channel of the thin-film transistor.

In order to compare the disclosed thin-film transistor and array substrate having the active layer with the interlaced graphene layers and the oxide semiconductor layers with the a thin-film transistor and array substrate having an active layer with pure oxide semiconductor, a plurality of exemplary embodiments are provided. The embodiments for the thin-film transistor and array substrate having an active layer made of pure oxide semiconductor are referred as reference embodiments.

An exemplary fabrication process of an array substrate according to the disclosed embodiments, referred as disclosed Embodiment 1, may include, sequentially, providing a transparent substrate; forming a gate material layer on the transparent substrate; forming a first photoresist layer on the gate material layer; performing an exposure and development process on the first photoresist layer to form a first patterned photoresist layer; etching the gate material layer using the first patterned photoresist layer as an etching mask to form a gate, a plurality of gate lines and a plurality of common electrode lines for the thin-film transistor; forming an insulation layer as the gate insulation layer using a vapor deposition method on the transparent substrate having the gate; preparing a mixture by mixing a metal salt solution and a graphene oxide solution; preparing a homogeneous mixture solution by placing a container containing the mixture a water bath; coating the homogeneous mixture on the substrate having the gate insulation layer by an inkjet printing process to form a pattern of the mixture solution having the shape of an active layer; baking the pattern of the mixture solution material layer having the shape of the active layer in an oven; annealing the baked pattern having the shape of the active layer in an annealing furnace to form the active layer; forming a source/drain material layer on the active layer; forming a second photoresist layer on the source/drain material layer; performing an exposure and development process on the second photoresist layer to form a second patterned photoresist layer; etching the source/drain material layer using the second patterned photoresist layer as an etching mask to form the source, the drain and data lines of the thin-film transistor.

An exemplary fabrication process of a thin-film transistor with bottom gate structure according to the disclosed embodiments, referred as Embodiment 2, may include, sequentially, S400, providing a transparent substrate; S401, forming a gate material layer made of Mo on the transparent substrate using a sputtering process; S402, forming a first photoresist layer on the gate material layer; S403, performing an exposure and development process on the first photoresist layer to form a first patterned photoresist layer; S404, etching the gate material layer using the first patterned photoresist layer as an etching mask to form a gate structure; S405, forming a SiO, layer as a gate insulation layer by an evaporation deposition method on the substrate; S406, preparing a mixture by mixing 500 mL 1 mol/L $Zn(NO_3)_2$ solution and 1250 mL 5 mg/mL graphene oxide solution; S407, preparing a homogeneous mixture solution by placing the container having the mixture obtained in step S406 in a water bath with a temperature of the water bath of 80° C. and a duration of 0.5 h; S408, coating the homogeneous mixture solution obtained in step S407 on the substrate with the gate insulation layer obtained in step S405 by an inkjet printing method, the pattern of the mixture solution on the substrate is corresponding to the shape of an active layer; S409, baking the substrate coated with the mixture solution material layer obtained in step 408 in an oven with a baking temperature of 120° C. and a duration of 0.5 h; S410, annealing the substrate with the baked pattern (solute of the solution) obtained in step S409 in an annealing furnace with argon as a protective gas, the annealing temperature is 200° C. and the duration is 2 h, to form the active layer on the substrate with above described semiconductor material wherein, the $Zn(NO_3)_2$ reacts with the graphene oxide, and ZnO and graphene are formed; S411, forming a source/drain material layer made of Mo on the substrate having the active layer by a sputtering process; S412, forming a second photoresist layer on the source/drain material layer; S413, performing an exposure and development process on the second photoresist layer to form a second patterned photoresist layer; and S414, etching the source/drain material layer using the second patterned photoresist layer as an etching mask to form a pattern having the source and the drain. Thus, a thin-film transistor may be formed after steps S400~S414.

Another exemplary fabrication process of a thin-film transistor according to the disclosed embodiments, referred as Embodiment 3, may include, sequentially, S500, providing a transparent substrate; S501, forming a source/drain material layer made of Mo on the transparent substrate by a sputtering process; S502, forming a first photoresist layer on the source/drain material layer; S503, performing an exposure and development process on the first photoresist layer to form a first patterned photoresist layer; S504, etching the source/drain material layer using the first patterned photoresist layer as an etching mask to form the source and the drain; S505, preparing a mixture by mixing 500 mL 0.8 mol/L $Zn(NO_3)_2$ solution and 1250 mL 3 mg/mL graphene oxide solution; S506, preparing a homogeneous mixture solution by placing the container containing the mixture obtained in step S505 in a water bath with a temperature of 60° C. and a duration of 2 h; S507 coating the homogeneous mixture solution obtained in step S506 on the substrate having the source and the drain formed in step S505 by an inkjet printing method, the pattern of the mixture solution on the substrate is corresponding to the shape of an active layer; S508, baking the substrate obtained in step 507 coated with the mixture solution material layer in an oven with a baking temperature of 120° C. and a duration of 0.5 h; S509, annealing the substrate with the baked solute obtained in step S508 in an annealing furnace with argon as a protection gas, an annealing temperature of 200° C., and a duration of 2 h, to form an active layer on the substrate with above described semiconductor material, wherein, the $Zn(NO_3)$ reacts with the graphene oxide, and ZnO and graphene are formed; S510, forming a SiO, layer as the gate insulation layer by an evaporation deposition method on the substrate with the active layer; S511, forming a gate material layer made of Mo on the substrate having the active layer by a sputtering process; S512, forming a second photoresist layer on the gate material layer; S513, performing an exposure and development process on the second photoresist layer to form a second patterned photoresist layer; and S514, etching the gate material layer using the second patterned photoresist layer as an etching mask to form the pattern having a gate structure. Thus, another thin-film transistor may be formed after steps S500~S514.

Further, an exemplary process for forming a thin-film transistor according to a first reference embodiment 1, includes, sequentially, S600, providing a transparent substrate; S601, forming a gate material layer made of Mo on the transparent substrate by a sputtering process; S602, forming a first photoresist layer on the gate material layer; S603, performing an exposure and development process on the first photoresist layer to form a first patterned photoresist layer; S604, etching the gate material layer using the first patterned photoresist layer as an etching mask to form a gate structure; S605, forming a SiO, layer as a gate insulation layer by an evaporation deposition method on the substrate; S606, forming a ZnO layer on the substrate with the gate insulation layer obtained in step S605 by a sputtering process; S607, forming a second photoresist layer on the ZnO layer; S608, performing an exposure and development process on the second photoresist layer to form a second patterned photoresist layer; S609, etching the ZnO layer using the second patterned photoresist as an etching mask to form the pattern having the active layer; S610, forming a source/drain material layer made of Mo on the substrate with the active layer by a sputtering process; S611, forming a third photoresist layer on the source/drain material layer; S612, performing an exposure and development process on the third photoresist layer to form a third patterned photoresist layer; and S613, etching the source/drain material layer using the third patterned photoresist layer as an etching mask to form a pattern having the source and the drain. Thus, a thin-film transistor with ZnO as an active layer may be formed after above steps S600~S613.

Further, another exemplary fabrication process of a thin-film transistor according to a second reference embodiment 2 may include, sequentially, S700, providing a transparent substrate; S701, forming a gate material layer made of Mo on the transparent substrate by a sputtering process; S702, forming a first photoresist layer on the gate material layer; S703, performing an exposure and development process on the first photoresist layer to form a first patterned photoresist layer; S704, etching the gate material layer using the first patterned photoresist layer as an etching mask to form a gate structure; S705, forming a first SiO, layer as a gate insulation layer by an evaporation deposition method on the substrate having the gate structure; S706, forming a ZnO layer on the substrate with the gate insulation layer obtained in step S705 by a sputtering process; S707, forming a second photoresist layer on the ZnO layer; S708, performing an exposure and development process on the second photoresist layer to form a second patterned photoresist layer; S709, etching the ZnO layer using the second patterned photoresist layer as an etching mask to form a pattern having an active layer; S710, forming a second SiO layer by an evaporation deposition method on the substrate having the active layer; S711, forming a third photoresist layer on the ZnO layer; S712, performing an exposure and development process on the third photoresist layer to form a third patterned photoresist layer; and S713, etching the second SiO layer using the third patterned photoresist layer as an etching mask to form an etch-stop layer, and forming a source via and a drain via both penetrating through the etch-stop layer by etching the etch-stop layer; S714, forming a source/drain material layer made of Moon substrate having the active layer by a sputtering process; S715, forming a fourth photoresist layer on the source/drain material layer; S716, performing an exposure and development process on the fourth photoresist layer to form a fourth patterned photoresist layer; and S717, etching the source/drain material layer using the fourth patterned photoresist layer as an etching mask to form a pattern having the source and the drain. Thus, another thin-film transistor with ZnO as an active layer may be formed after above steps S700~S717.

After forming the thin-film transistors according to the disclosed embodiments 2~3 and the reference embodiments 1~2, the carrier mobility of the thin-film transistors may be measured by an electronic parameter measurement (EPM method, an experimental embodiment). The results are shown in Table 1.

FIG. 12 illustrates an exemplary EPM method for measuring the carrier mobility of the thin-film transistors according to the disclosed embodiments and the reference embodiments. Specifically, the procedure of EPM method may include S801, measuring the change of drain current ID when a 10V voltage is applied between the source and the drain of the thin-film transistor and a gate voltage $V_{GS}$ is scanned from −30 V to 30 V; and S802, drawing a $V_g$-$I_d$ curve and calculating the carrier mobility of the material using an equation:

$$I_D = \mu C_i \frac{W}{2L}(U_{GS} - U_{TH})^2,$$

Wherein, µ refers to the carrier mobility; $C_i$ refers to the specific capacitance of the insulation layer of the thin-film transistor; W refers to the channel width of the thin-film transistor; L refers to the channel length of the thin-film transistor; and $U_{TH}$ refers to the threshold voltage of the thin-film transistor.

TABLE 1

| | Embodiment # | | | |
|---|---|---|---|---|
| | Embodiment 1 | Embodiment 2 | Reference Embodiment 1 | Reference Embodiment 2 |
| Carrier Mobility ($cm^2V^{-1}s^{-1}$) | 8.5 | 9.5 | unmeasurable | 3 |

According to the test result of the reference embodiment 1, when the thin-film transistor is formed using the oxide semiconductor material ZnO as the active layer, ZnO in the channel region may be eroded. Therefore, the carrier mobility cannot be measured. Further, according to the reference Embodiment 2, when the thin-film transistor is formed using ZnO as an active material, an etch-stop layer may be necessarily added on top of the active layer to ensure the integrity of the channel region and fulfill the switching characteristics of the thin-film transistor.

Further, Comparing with the thin-film transistor formed in the reference Embodiment 2, the active layer of the thin-film transistor provided in the disclosed embodiments (refer to the testing results of the Embodiment 2 and the Embodiment 3) may have higher carrier mobility than that of the transistors according to the reference embodiments. Further, the thin-film transistors provided in the disclosed embodiments may not require the etch-stop layer. Therefore, the disclosed thin-film transistor may have a simpler structure, and the manufacturing process may be simpler.

Further, a Scanning Electron Microscope (SEM) experiment is used to characterize the transistor formed according to the disclosed embodiments and the reference embodiments. That is, after forming the source and the drain, SEM is used to image portions of the active layer between the source and the drain. According to the SEM images (not included), for the structures formed in Embodiment 2 and Embodiment 3, the surface of the portions of the active layer between the source and the drain is smoother without obvious pits. For the structures formed according to the reference embodiment 1, ZnO in the channel region is eroded. For the structure formed according to the reference Embodiment 2, the surface of ZnO between the source and the drain is smoother.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A fabrication method of an array substrate having at least one thin-film transistor, the method comprising:
    providing a substrate; and
    forming a pattern having an active layer configured as a channel of the thin-film transistor on the substrate, including:
        coating a homogeneous mixture having an oxide semiconductor and a graphene on the substrate; and
        baking and annealing the substrate coated with the homogeneous mixture;
    wherein:
        the active layer is a mixture of the oxide semiconductor and the graphene,
        the homogeneous mixture formed on the substrate has a shape of the active layer of the thin-film transistor,
        the homogenous mixture is coated by an inkjet printing process,
        a temperature for annealing the homogenous mixture after the baking process is in a range of approximately 200° C.~400° C.,
        an inert gas atmosphere is used in the annealing process, and
        a duration of the annealing process is in a range of approximately 1 h~2 h.

2. The fabrication method according to claim 1, wherein:
    a temperature for baking the homogenous mixture is in a range of approximately 40° C.~120° C.; and
    a duration of the baking process is in a range of approximately 0.5 h~1 h.

3. The fabrication method according to claim 1, wherein: the graphene is in a form of micro-sheets, the micro-sheets being evenly distributed in irregular directions to prevent the active layer from being damaged during a subsequent etching process.

4. The fabrication method according to claim 1, wherein: a work function of the oxide semiconductor is smaller than a work function of the graphene.

5. A fabrication method of an array substrate having at least one thin-film transistor, the method comprising:
    providing a substrate; and
    forming a pattern having an active layer configured as a channel of the thin-film transistor on the substrate,
    wherein:
        the active layer is a mixture of an oxide semiconductor and a graphene,
        the graphene is in a form of micro-sheets, and the micro-sheets are evenly distributed in irregular directions to prevent the active layer from being damaged during a subsequent etching process, and
        the oxide semiconductor and the graphene are formed by a reaction of a metal salt solution with a graphene oxide in an alkaline condition.

6. A fabrication method of an array substrate having at least one thin-film transistor, the method comprising:
    providing a substrate; and
    forming a pattern having an active layer configured as a channel of the thin-film transistor on the substrate,
    wherein:
        the active layer is a mixture of an oxide semiconductor and a graphene,
        the graphene is in a form of micro-sheets, and the micro-sheets are evenly distributed in irregular directions to prevent the active layer from being damaged during a subsequent etching process, and
        the oxide semiconductor and the graphene are formed by a reaction of a metal salt solution with a graphene oxide, the metal salt solution including at least one of $Zn(NO_3)_2$ solution, $In(NO_3)_3$ solution, or $SnCl_2$ solution.

* * * * *